(12) United States Patent
Soh

(10) Patent No.: US 8,610,476 B1
(45) Date of Patent: Dec. 17, 2013

(54) APPARATUS AND METHODS FOR LOCK DETECTION FOR SEMI-DIGITAL AND FULLY-DIGITAL CLOCK DATA RECOVERY

(75) Inventor: Lip Kai Soh, Sitiawan Perak (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/618,832

(22) Filed: Sep. 14, 2012

(51) Int. Cl.
*H03L 7/06* (2006.01)
(52) U.S. Cl.
USPC ............. 327/159; 327/9; 375/376; 331/1 A
(58) Field of Classification Search
USPC .................. 327/156–161, 20, 2–12, 91, 141, 327/49–57, 147; 331/1 A; 375/371–376, 375/326
See application file for complete search history.

(56) References Cited

U.S. PATENT DOCUMENTS

| | | | | |
|---|---|---|---|---|
| 7,349,506 B2* | 3/2008 | Shizuki | | 375/350 |
| 7,555,085 B1* | 6/2009 | Risk et al. | | 375/354 |
| 7,680,232 B2 | 3/2010 | Shumarayev et al. | | |
| 7,839,177 B1 | 11/2010 | Soh | | |
| 8,253,451 B1* | 8/2012 | Hsieh et al. | | 327/141 |
| 8,433,020 B2* | 4/2013 | Buchwald et al. | | 375/355 |
| 8,433,022 B2* | 4/2013 | Onodera | | 375/355 |
| 2004/0252804 A1* | 12/2004 | Aoyama | | 375/376 |
| 2010/0091927 A1 | 4/2010 | Walker et al. | | |
| 2012/0163519 A1* | 6/2012 | Choudhury | | 375/354 |

OTHER PUBLICATIONS

J. Sonntag and R. Leonowich, "A Monolithic CMOS 10 MHz DPLL for Burst-Mode Data Retiming", Feb. 16, 1990, pp. 194-195, ISSCC 90, Continental Ballroom 1-4, IEEE International Solid-State Circuits Conference.
Thomas H. Lee et al., "A 2.5 V CMOS Delay-Locked Loop for 18 Mbit, 500 Megabyte/s DRAM", Dec. 1994, pp. 1491-1496, IEEE Journal of Solid-State Circuits, vol. 29, No. 12.
S. Sidiropoulos and M. Horowitz, "A Semidigital Dual Delay-Locked Loop", Nov. 1997, pp. 1683-1692, IEEE Journal of Solid-State Circuits, vol. 32, No. 11.
J. Savoj and B. Razavi, "A 10-Gb/s Clock and Data Recovery Circuit with a Half-Rate Linear Phase Detector", May 2001, pp. 761-768, IEEE Journal of Solid-State Circuits, vol. 36, No. 5.
J. Savoj and B. Razavi, "A 10-Gb/s Clock and Data Recovery Circuit with a Half-Rate Binary Phase/Frequency Detector", Jan. 2003, pp. 13-21, IEEE Journal of Solid-State Circuits, vol. 38, No. 1.
M. Rau et al., "Clock/Data Recovery PLL Using Half-Frequency Clock", Jul. 1997, pp. 1156-1159, IEEE Journal of Solid-State Circuits, vol. 32, No. 7.

(Continued)

*Primary Examiner* — Lincoln Donovan
*Assistant Examiner* — Thomas Skibinski
(74) *Attorney, Agent, or Firm* — Okamoto & Benedicto LLP

(57) ABSTRACT

One embodiment relates to a lock detection circuit. The lock detection circuit includes at least a dither detection circuit and a lock filter. The dither detection circuit maintains a bi-directional count based on early and late signals from a sampler circuit and asserts a non-lock signal if the bi-directional count reaches either a positive non-lock assertion threshold or a negative non-lock assertion threshold. The lock filter increments a lock filter count for each sample and outputs a lock-initiated signal when the lock filter count reaches a pre-set maximum value. The maximum value of the lock filter count is greater than the non-lock assertion thresholds. Other embodiments and features are also disclosed.

15 Claims, 9 Drawing Sheets

110

(56) References Cited

OTHER PUBLICATIONS

R. Kreienkamp et al., "A 10-Gb/s CMOS Clock and Data Recovery Circuit with an Analog Phase Interpolator", 2003, pp. 73-76, IEEE Custom Integrated Circuits Conference.

Pavan Kumar Hanumolu, et al., "A Wide-Tracking Range Clock and Data Recovery Circuit", Feb. 2008, pp. 425-439, IEEE Journal of Solid-State Circuits, vol. 43. No. 2.

J.D.H. Alexander, "Clock Recovery from Random Binary Signals", Sep. 26, 1975, pp. 541-542, Electronic Letters, Dept. of Engineering, University of Aberdeen, Aberdeen AB9 1AS, Scotland.

* cited by examiner

FIG. 5    500

APPARATUS AND METHODS FOR LOCK DETECTION FOR SEMI-DIGITAL AND FULLY-DIGITAL CLOCK DATA RECOVERY

BACKGROUND

1. Technical Field

The present invention relates generally to data communications.

2. Description of the Background Art

High-speed data links are used to communicate data between devices in a system. Serial interface protocols have been developed at increasingly fast data rates for such high-speed links. Examples of industry-standard protocols for serial interfaces include PCI Express® (Peripheral Component Interconnect Express), XAUI (X Attachment Unit Interface), sRIO (serial Rapid IO), and others.

Market demands for transceiver data rates for high-speed data links continue to increase. In recent years, the demanded increase in transceiver data rates has exceeded gains based on process improvements alone. As such, improvements in transceiver design are also needed to provide the desired increases in speed.

SUMMARY

One embodiment relates to a lock detection circuit. The lock detection circuit includes at least a dither detection circuit and a lock filter. The dither detection circuit maintains a bi-directional count based on early and late signals from a sampler circuit and asserts a non-lock signal if the bi-directional count reaches either a positive non-lock assertion threshold or a negative non-lock assertion threshold. The lock filter increments a lock filter count for each sample and outputs a lock-initiated signal when the lock filter count reaches a pre-set maximum value. The maximum value of the lock filter count is greater than the non-lock assertion thresholds.

Another embodiment relates to a method for detecting a lock state of a semi-digital or digital clock data recovery circuit. A bi-directional count is maintained based on early and late signals from a sampler circuit, and a non-lock signal is asserted if the bi-directional count reaches either a positive non-lock assertion threshold or a negative non-lock assertion threshold. In addition, a lock filter count is incremented for each sample, and a lock-initiated signal is output when the lock filter count reaches a pre-set maximum value.

Other embodiments and features are also disclosed.

DETAILED DESCRIPTION

Clock data recovery (CDR) circuits may be categorized as analog CDR circuits, semi-digital CDR circuits, and fully-digital CDR circuits. Analog CDR circuits are typically based on phase-locked loop (PLL) circuits. Semi-digital CDR circuits are interpolator based. Fully-digital CDR circuits typically utilize a digitally controlled oscillator.

Conventional lock detection circuitry for an analog CDR circuit measures the frequency offset difference between the reference clock and recovered clock to detect when the CDR circuit has achieved a lock state. However, when this method is used for a semi-digital CDR circuit, such as an interpolator-based CDR circuit, it cannot function properly because the input reference clock and the recovered clock come from the same source. Similarly, the method mentioned above is not useful for lock detection for a fully-digital CDR circuit.

The present disclosure provides innovative technique for lock detection for semi-digital and fully-digital clock and data recovery (CDR) circuits. As observed by the applicant, the "early" and "late" outputs from an interpolator-based CDR's sampler will toggle interchangeably when the CDR is in a lock state. The present disclosure utilizes this behavior to determine the state of the CDR. The presently-disclosed lock detection technique may be implemented using a dither detection circuit and a lock filter, where the lock filter may be an n-bit binary counter.

The technique disclosed herein has various benefits and advantages. First, it solves a need to detect a lock state in semi-digital (interpolator-based) CDR circuits. Second, the technique may be used to detect a lock state in both semi-digital and fully-digital CDR circuits. Third, the technique requires a small area for its circuitry and consumes a small amount of power.

Figure 1:
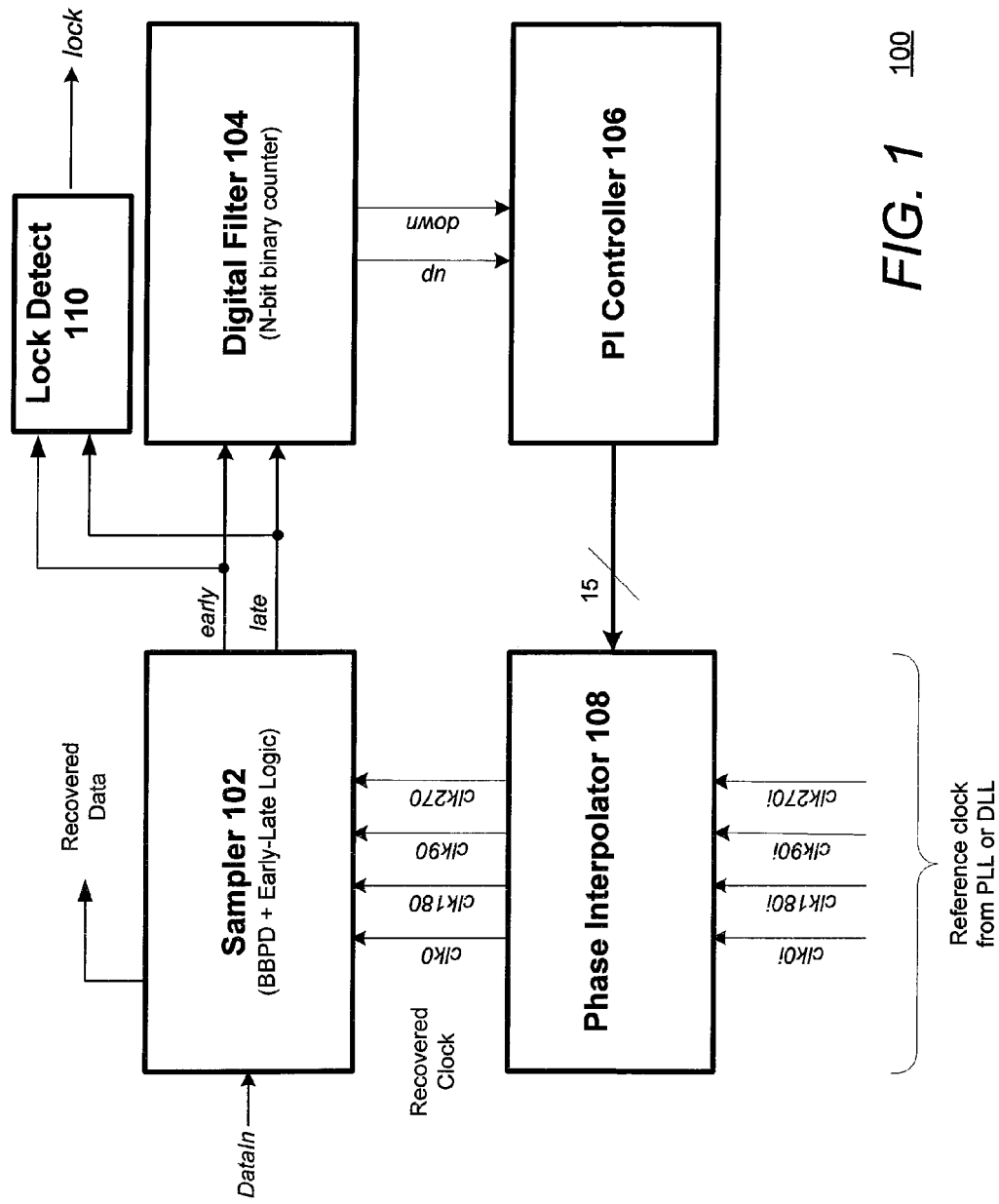
FIG. 1 depicts a clock and data recovery circuit that includes a lock detection circuit in accordance with an embodiment of the invention.

FIG. 1 depicts a clock and data recovery (CDR) circuit 100 that includes a lock detection circuit 110 in accordance with an embodiment of the invention. As shown, the CDR circuit 100 is interpolator based and includes a circuit loop that is formed by a sampler (phase detector) circuit 102, a digital filter circuit 104, a phase interpolator (PI) control circuit 106, and a phase interpolator circuit 108.

The sampler circuit 102 may be configured to receive an incoming serial data signal (DataIn) that may be at a data rate of X gigabits per second. The sampler circuit 102 may be configured to sample the input data signal to determine the position of a sampling clock with respect to the input data signal. The sampling clock may be generated by the phase interpolator circuit 108. As shown in FIG. 1, the sampling clock may include four clock signals, shown as clk0, clk90, clk180, and clk270, which have a phase difference of 90 degrees ($\pi/2$ radians) between them.

If the sampling clock is leading the input data signal, then an early signal may be asserted (set to high) by the sampler circuit 102; and, if the sampling clock is lagging the input data signal, then a late signal may be asserted (set to high) by the sampler circuit 102. The early and late signals together may be referred to as the feedback signal.

The feedback signal is provided to the digital filter circuit 104. Typically, the digital filter may be an N-bit binary counter. The digital filter circuit 104 may be arranged to compensate for the latency of the CDR loop and to reduce loop dithering. The digital filter circuit 104 may generate a filtered version of the feedback signal (i.e. a filtered feedback signal). The filtered feedback signal may include a down signal which is the filtered version of the early signal and an up signal which is the filtered version of the late signal. The digital filter circuit 104 may be programmable to a plurality of filter settings.

The filtered feedback signal may be received by the PI controller 106. The PI controller 106 may be arranged to generate an interpolator control signal based on the filtered feedback signal. The interpolator control signal may control the phase interpolator 108 to shift the phase of the sampling clock up or down or to maintain (i.e. not shift) the current phase of the sampling clock.

If the sampling clock is consistently early (leading) with respect to the input data signal, then the PI controller 106 will receive a down signal and will control the phase interpolator 108 to shift down the phase of the sampling clock. On the other hand, if the sampling clock is consistently late (lagging) with respect to the input data signal, then the PI controller 106 will receive an up signal and will control the phase interpolator 108 to shift up the phase of the sampling clock.

The phase interpolator circuit 108 may be arranged to receive a reference clock and generate the sampling clock. The reference clock may be received from a phase locked loop (PLL) or a delay locked loop (DLL) circuit. As shown in FIG. 1, the reference clock may include four clock signals, shown as clk0$i$, clk90$i$, clk180$i$, and clk270$i$, which have a phase difference of 90 degrees ($\pi/2$ radians) between them. The phase interpolator circuit 108 may generate the clock signals of the sampling clock (the recovered clock) by interpolation of the clock signals of the reference clock.

In accordance with an embodiment of the invention, the CDR circuit 100 further includes a lock detection circuit 110. The lock detection circuit 110 is arranged to generate a lock signal which indicates when the CDR circuit 100 is in a lock state. As shown, the lock detection circuit 110 may receive the early and late signals from the sampler 102.

Figure 2:
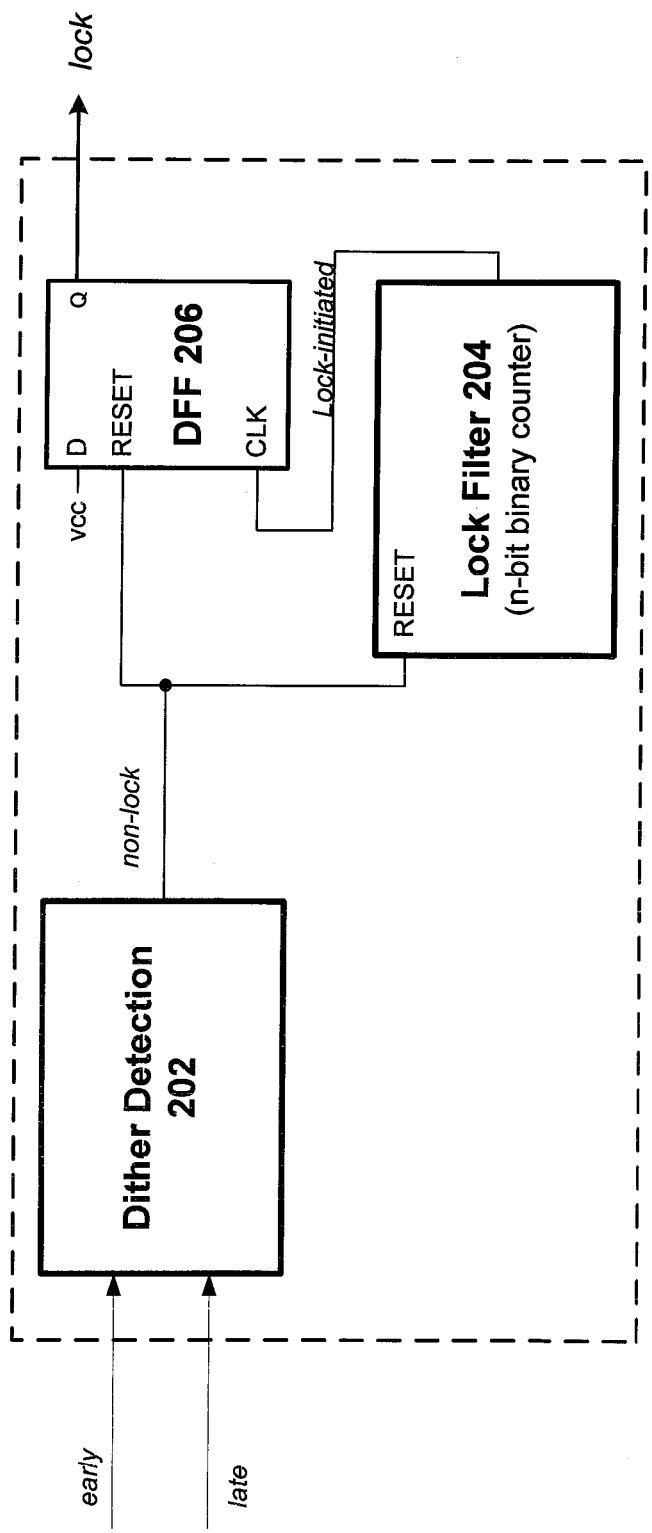
FIG. 2 depicts a lock detection circuit in accordance with an embodiment of the invention.

FIG. 2 depicts a lock detection circuit 110 in accordance with an embodiment of the invention. As shown, the lock detection circuit 110 may include a dither detection circuit 202, a lock filter 204, and a D flip-flop (DFF) 206.

The dither detection circuit 202 receives the early and late signals from the sampler 102. The output of the dither detection circuit 202 is a non-lock signal that may be asserted to the reset ports of the lock filter 204 and the DFF 206. One embodiment of the dither detection circuit 202 is described below in relation to FIG. 3.

The lock filter 204 may be implemented, for example, as an n-bit binary counter. The output of the lock filter 204 is a lock-initiated signal that may be asserted to the clock port of the DFF 206. The data input port of the DFF 206 may be connected to a supply voltage (VCC), and the data output port of the DFF 206 may generate the lock signal. The lock signal indicates when the CDR circuit 100 is in its lock state.

Functionally, the dither detection circuit 202 monitors the early and late signals from the sampler 102 to determine if they are toggling interchangeably (one after the other), or approximately interchangeably, such that a bi-directional count is within a range around the zero count. If the sampler's output is determined to be not toggling interchangeably by the bi-directional count reaching positive or negative non-lock thresholds, then the dither detection circuit 202 will assert the non-lock signal so as to reset the DFF 206 (such that the lock is de-asserted) and also reset the count (LFC) of the lock filter 204.

The lock filter 204 ensures that the sampler's output has been toggling interchangeably for some number of cycles, n, before the lock signal is asserted. The lock-initiated signal will be asserted by the lock filter 204 once the LFC reaches n. The lock-initiated signal will not be asserted if the lock filter 204 is reset before the LFC reaches n.

The lock signal will be asserted by the DFF 206 once it is triggered by the lock-initiated signal from the lock filter 204. The lock signal will be de-asserted by the DFF 206 upon receiving the non-lock signal from the dither detection circuit 202.

Figure 3:
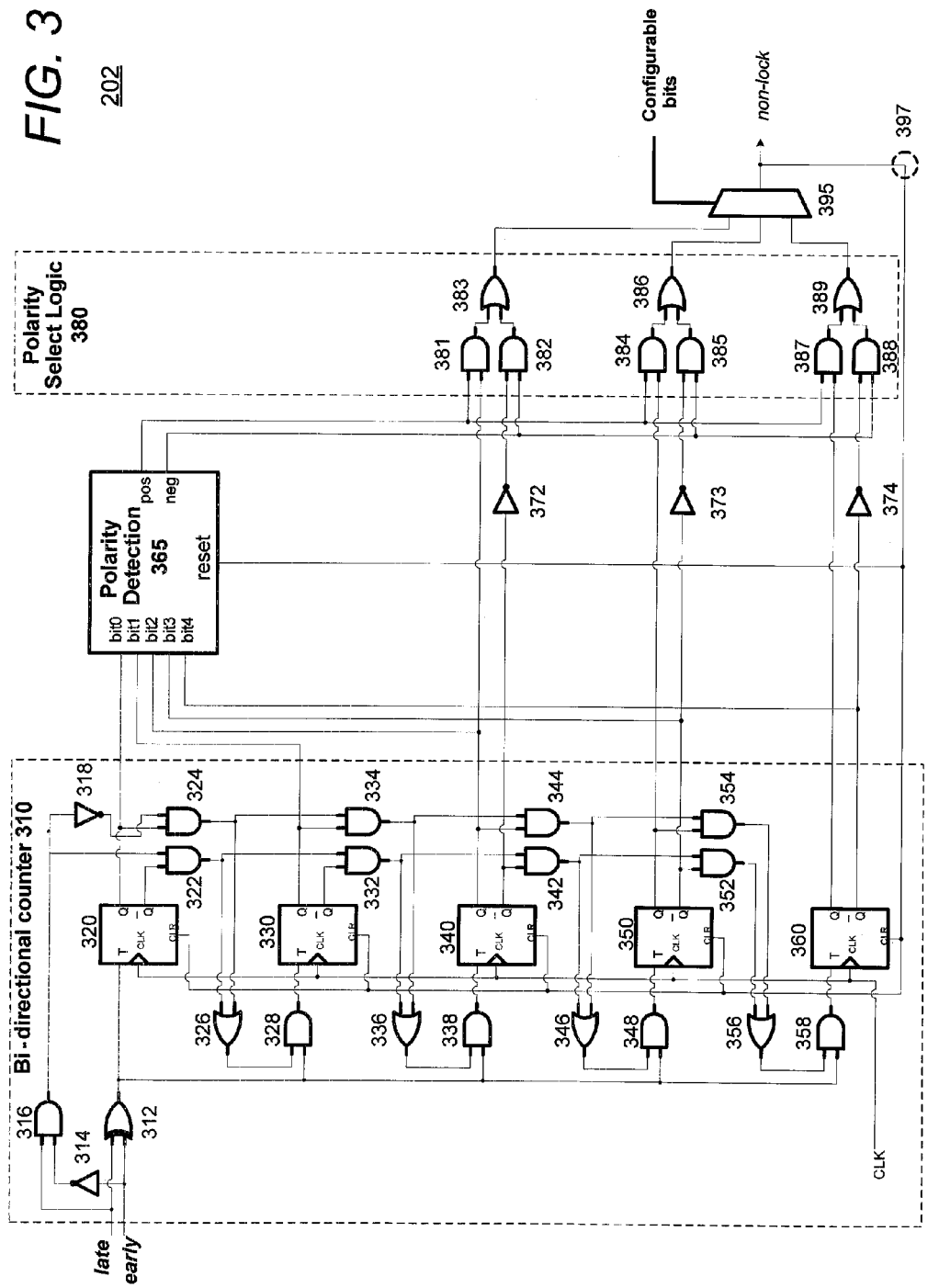
FIG. 3 depicts a dither detection circuit in accordance with an embodiment of the invention.

FIG. 3 depicts a dither detection circuit 202 in accordance with an embodiment of the invention. As shown, the dither detection circuit 202 may include a bi-directional counter 310, a polarity detection circuit 365, and polarity select logic 380.

A five-bit implementation of a bi-directional counter 310 is depicted in FIG. 3 and described herein. Other implementations of the bi-directional counter 310 are also possible. The bi-directional counter 310 need not necessarily use five bits and may instead use a larger or smaller number of bits than five. The count of the bi-directional counter 310 may be referred to as the bi-directional count (BDC) to distinguish it from the lock filter count (LFC).

The bi-directional counter 310 receives the late and early signals into exclusive OR (XOR) gate 312. The output of XOR gate 312 is provided to the data input port of T flip-flop (TFF) 320. The Q output of TFF 320 may be used as the bit0 output of the bi-directional counter 310. The Q output of TFF 320 is also provided to a first input of AND gate 324, and the Qbar output of TFF 320 is provided to a first input of AND gate 322. In addition, the early signal is inverted by inverter 314, and the late signal and inverted early signal are provided to the inputs of AND gate 316. The output of AND gate 316 is inverted by inverter 318. The output of AND gate 316 is provided to a second input of AND gate 322, and the inverted output of AND gate 316 is provided to a second input of AND gate 324. The outputs of AND gates 322 and 324 are provided to the inputs of OR gate 326.

The output of XOR gate 312 is also provided to a first input of AND gate 328, and the output of OR gate 326 is provided to a second input of AND gate 328. The output of AND gate 328 is provided to the data input of TFF 330. The Q output of TFF 330 may be used as the bit1 output of the bi-directional counter 310. The Q output of TFF 330 is also provided to a first input of AND gate 334, and the Qbar output of TFF 330 is provided to a first input of AND gate 332. In addition, the output of AND gate 322 is provided to a second input of AND gate 332, and the output of AND gate 324 is provided to a second input of AND gate 334. The outputs of AND gates 332 and 334 are provided to the inputs of OR gate 336.

The output of XOR gate 312 is also provided to a first input of AND gate 338, and the output of OR gate 336 is provided to a second input of AND gate 338. The output of AND gate 338 is provided to the data input of TFF 340. The Q output of TFF 340 may be used as the bit2 output of the bi-directional counter 310. The Q output of TFF 340 is also provided to a first input of AND gate 344, and the Qbar output of TFF 340 is provided to a first input of AND gate 342. In addition, the output of AND gate 332 is provided to a second input of AND gate 342, and the output of AND gate 334 is provided to a second input of AND gate 344. The outputs of AND gates 342 and 344 are provided to the inputs of OR gate 346.

The output of XOR gate 312 is also provided to a first input of AND gate 348, and the output of OR gate 346 is provided to a second input of AND gate 348. The output of AND gate 348 is provided to the data input of TFF 350. The Q output of TFF 350 may be used as the bit3 output of the bi-directional counter 310. The Q output of TFF 350 is also provided to a first input of AND gate 354, and the Qbar output of TFF 350 is provided to a first input of AND gate 352. In addition, the output of AND gate 342 is provided to a second input of AND gate 352, and the output of AND gate 344 is provided to a second input of AND gate 354. The outputs of AND gates 352 and 354 are provided to the inputs of OR gate 356.

The output of XOR gate 312 is also provided to a first input of AND gate 358, and the output of OR gate 356 is provided to a second input of AND gate 358. The output of AND gate 358 is provided to the data input port of TFF 360. The Q output of TFF 360 may be used as the bit4 output of the bi-directional counter 310.

A clock signal CLK may be provided to the clock ports of the five T flip-flops (TFF 320, TFF 330, TFF 340, TFF 350 and TFF 360). As mentioned above, the five bi-directional counter bits (bit0, bit1, bit2, bit3 and bit4) are provided by the Q outputs of the five T flip-flops. The five bi-directional counter bits may be provided to inputs of the polarity detection circuit 365. One embodiment of the polarity detection circuit 365 is described below in relation to FIG. 4.

In addition, the higher counter bits may be provided to the polarity select logic 380. In the example shown in FIG. 3, the higher counter bits include bit2, bit3 and bit4. In particular, as shown in FIG. 3, the Q outputs of TFFs 340, 350 and 360 may be provided to the first inputs of AND gates 381, 384, and 387, respectively. In addition, the Qbar outputs of TFF 340, 350 and 360 may be inverted by inverters 372, 373, and 374, respectively, and the inverted Qbar outputs are provided to the first inputs of AND gates 382, 385, and 388.

The outputs of AND gates 381 and 382 are provided to the inputs of OR gate 383. The outputs of AND gates 384 and 385 are provided to the inputs of the OR gate 386. The outputs of AND gate 387 and 388 are provided to the inputs of the OR gate 389. The outputs of OR gates 383, 386, and 389 are provided to a selector 395 which is controlled by configurable bits (which may be memory such as, for example, RAM).

The output of the selector 395 is the non-lock signal which is provided to the lock filter 204 and the DFF 206. A connection 397 also routes the non-lock signal to the reset port of the polarity detection circuit 365 and to the clear (CLR) ports of the TFFs (320, 330, 340, 350 and 360).

Consider a first case where the selector 395 is configured to select the signal output from OR gate 383 which is related to bit2. OR gate 383 outputs a logical zero unless either (i) the positive polarity (pos) signal is asserted and bit2 is logical one, or (ii) the negative polarity (neg) signal is asserted and bit2 is logical zero. The first instance happens when the BDC reaches 00111 or +7 in decimal, and the second instance happens when BDC reaches 11000 in binary or −7 in decimal. Hence, if the selector 395 is configured to select the input related to bit2, then the non-lock signal is asserted when BDC reaches +/−7. At that point, the asserted non-lock signal is routed 397 back to trigger a reset of the bi-directional counter 310 and the polarity detection circuit 365. This causes the de-assertion of the non-lock signal, until the BDC again reaches +/−7.

Consider a second case where the selector 395 is configured to select the signal output from OR gate 386 which is related to bit3. OR gate 386 outputs a logical zero unless either (i) the positive polarity (pos) signal is asserted and bit3 is logical one, or (ii) the negative polarity (neg) signal is asserted and bit3 is logical zero. The first instance happens when the BDC reaches 01011 or +11 in decimal, and the second instance happens when BDC reaches 10100 in binary or −11 in decimal. Hence, if the selector 395 is configured to select the input related to bit3, then the non-lock signal is asserted when BDC reaches +/−11. At that point, the asserted non-lock signal is routed 397 back to trigger a reset of the bi-directional counter 310 and the polarity detection circuit 365. This causes the de-assertion of the non-lock signal, until the BDC again reaches +/−11.

Consider a third case where the selector 395 is configured to select the signal output from OR gate 389 which is related to bit4. OR gate 389 outputs a logical zero unless either (i) the positive polarity (pos) signal is asserted and bit4 is logical one, or (ii) the negative polarity (neg) signal is asserted and bit4 is logical zero. The first instance happens when the BDC reaches 10011 or +19 in decimal, and the second instance happens when BDC reaches 01100 in binary or −19 in decimal. Hence, if the selector 395 is configured to select the input related to bit4, then the non-lock signal is asserted when BDC reaches +/−19. At that point, the asserted non-lock signal is routed 397 back to trigger a reset of the bi-directional counter 310 and the polarity detection circuit 365. This causes the de-assertion of the non-lock signal, until the BDC again reaches +/−19.

Figure 4:
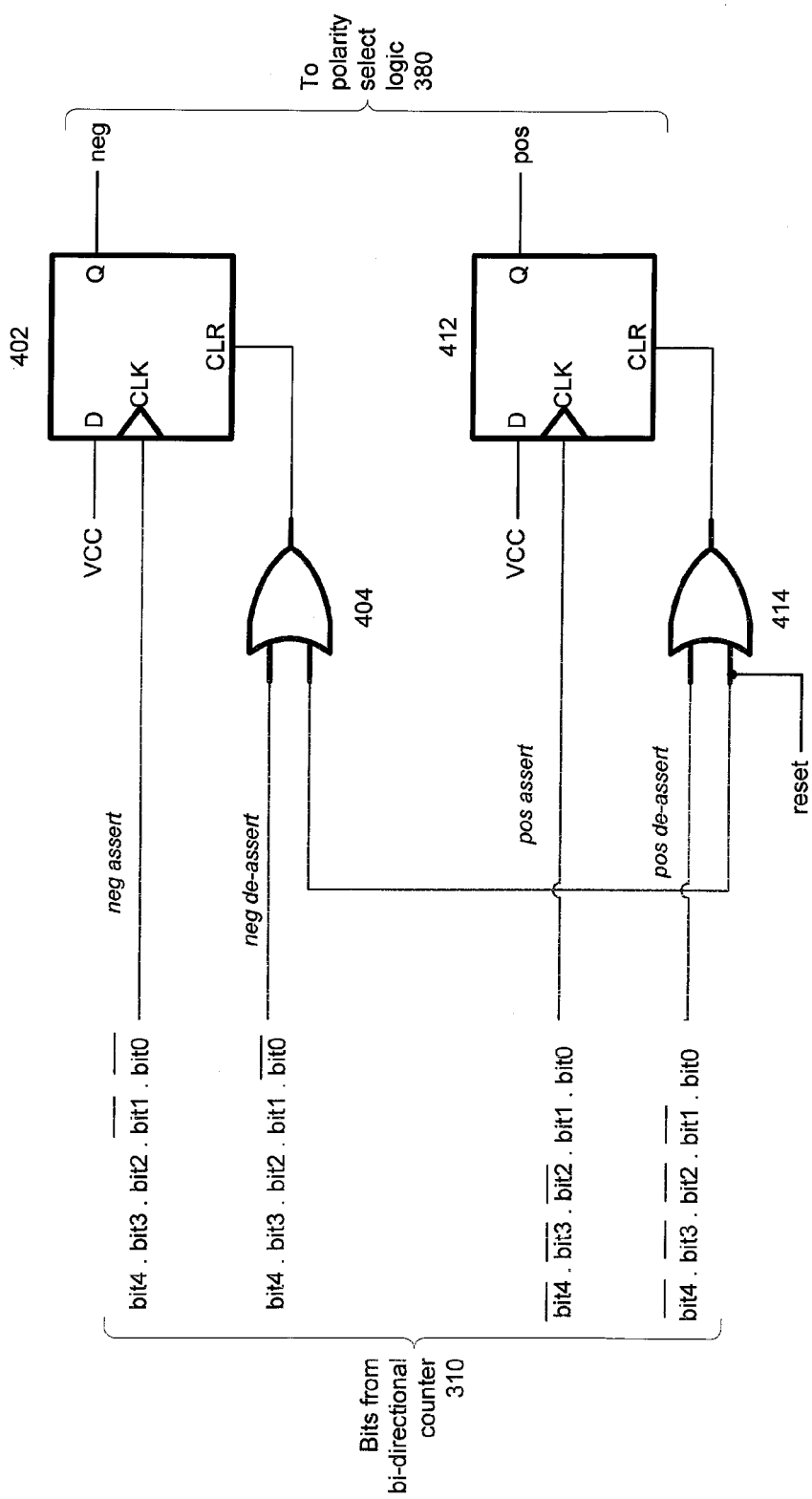
FIG. 4 depicts a polarity detection circuit in accordance with an embodiment of the invention.

FIG. 4 depicts a polarity detection circuit 365 in accordance with an embodiment of the invention. The polarity detection circuit 365 includes two D flip-flops (DFFs) 402 and 412 and two OR gates 404 and 414. The data output of the first DFF 402 provides a negative polarity signal (neg) indicative of a negative polarity count, and the data output of the second DFF 404 provides a positive polarity signal (pos) indicative of a positive polarity count.

The clock port of DFF 402 receives a negative assertion (neg assert) signal from first multiple-bit AND logic. In this example, the first multiple-bit AND logic performs the logical AND of five bits: bit4; bit3; bit2; inverted bit1; and inverted bit0. Hence, the neg assert signal is zero unless the BDC is 11100 in binary, which is equivalent to −3 in decimal. When the BDC reaches 11100, then the output Q of DFF 402 goes from logical zero to logical one. This is because the data input for DFF 402 is tied to the supply voltage VCC.

Similarly, the clock port of DFF 412 receives a positive assertion (pos assert) signal from second multiple-bit AND logic. In this example, the second multiple-bit AND logic performs the logical AND of five bits: inverted bit4; inverted bit3; inverted bit2; bit1; and bit0. Hence, the pos assert signal is zero unless the BDC is 00011 in binary, which is equivalent to +3 in decimal. When the BDC reaches 00011, then the output Q of DFF 412 goes from logical zero to logical one. This is because the data input for DFF 412 is tied to the supply voltage VCC.

OR gate 404 receives both a negative de-assertion (neg de-assert) signal from third multiple-bit AND logic and a reset signal (comprising the non-lock signal). The output of OR gate 404 is provided to the clear port of DFF 402. In this example, the third multiple-bit AND logic performs the logical AND of five bits: bit4; bit3; bit2; bit1; and inverted bit0. Hence, the neg de-assert signal is zero unless the BDC is 11110 in binary, which is equivalent to −1 in decimal. When the BDC reaches 11110, then the output Q of DFF 402 is cleared to logical zero. The output Q of DFF 402 may also be cleared to logical zero if the reset signal is received.

Similarly, OR gate 414 receives both a positive de-assertion (pos de-assert) signal from fourth multiple-bit AND logic and a reset signal (comprising the non-lock signal). The output of OR gate 414 is provided to the clear port of DFF 412.

In this example, the fourth multiple-bit AND logic performs the logical AND of five bits: inverted bit4; inverted bit3; inverted bit2; inverted bit1; and bit0. Hence, the pos de-assert signal is zero unless the BDC is 00001 in binary, which is equivalent to +1 in decimal. When the BDC reaches 00001, then the output Q of DFF 412 is cleared to logical zero. The output Q of DFF 412 may also be cleared to logical zero if the reset signal is received.

Figure 5:
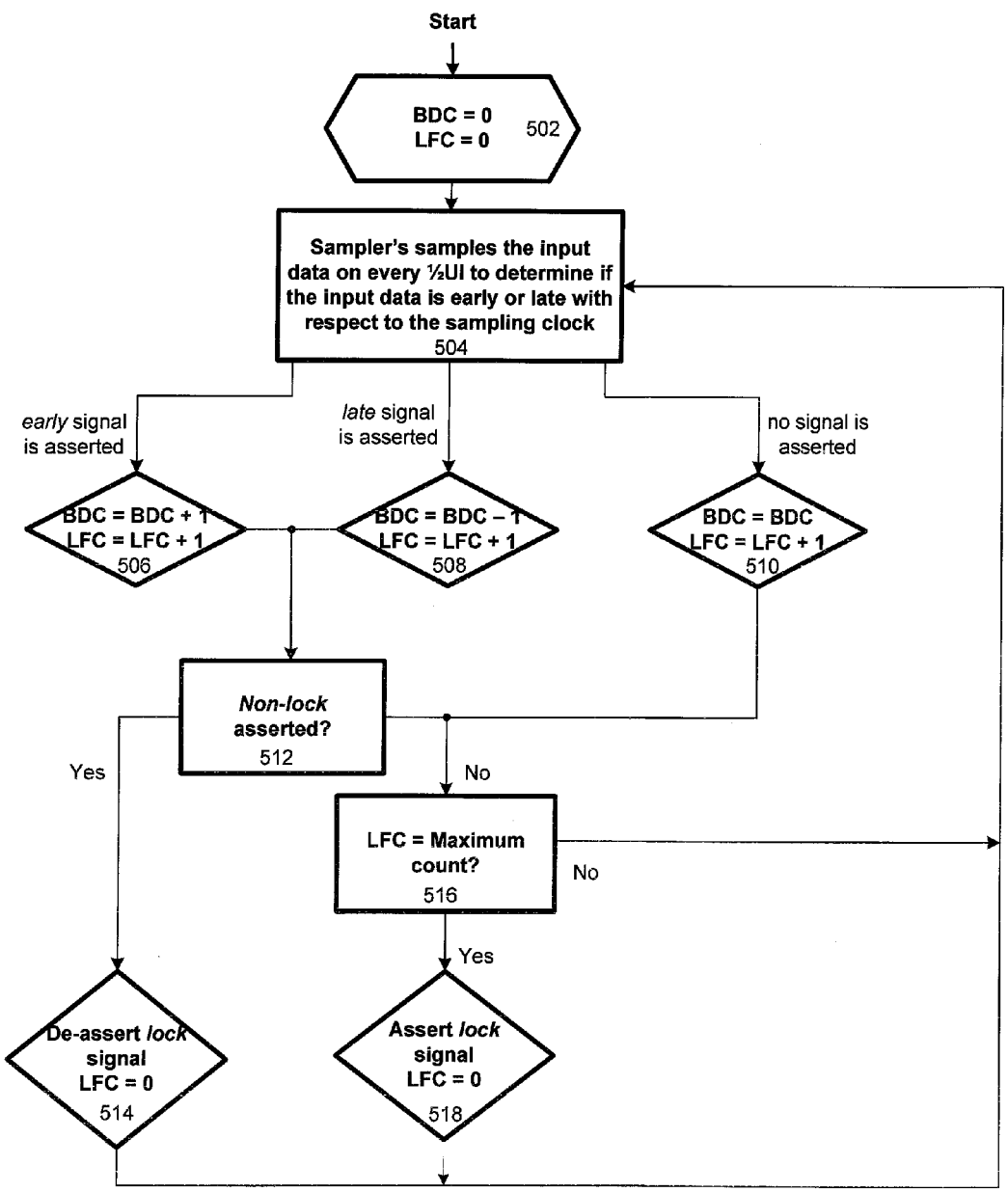
FIG. 5 is a flow chart for generating a lock signal in accordance with an embodiment of the invention.

FIG. 5 is a flow chart of a method 500 for generating a lock signal in accordance with an embodiment of the invention. The method 500 may be implemented by the circuitry described above in relation to FIGS. 2-4.

In a first step 502, the bi-directional counter (BDC) and the filter counter (LFC) may be each reset to zero. In a second step 504, the sampler 102 samples the input data on every ½ unit interval (UI) to determine if the input data is early or late (or neither early nor late) with respect to the sampling clock.

If an early signal is asserted by the sampler 102, then BDC and LFC are both incremented by one, as shown in step 506. On the other hand, if a late signal is asserted by the sampler 102, then BDC is decremented by one and LFC is incremented by one, as shown in step 508.

If no signal is asserted by the sampler 102 (indicating that the input data is neither early nor late), then BDC is kept at the same count while LFC is incremented by one, as shown in step 510. Thereafter, the method 500 moves on to step 516 which is described further below.

After either step 506 or step 508, a determination is made, per step 512, as to whether or not the non-lock signal is asserted. If the non-lock signal is asserted, then, per step 514, the lock signal may be de-asserted, and LFC may be reset to zero. Thereafter, the method 500 may loop back to step 504 so as to obtain and process the next sample.

On the other hand, if the non-lock signal is not asserted, then, per step 516, a determination is made as to whether LFC is equal to a predetermined maximum count. As mentioned above, step 516 may also be reached via step 510. The maximum value of the LFC should be greater than the non-lock assertion thresholds.

If LFC is determined to equal to the maximum count in step 516, then, per step 518, the lock signal may be asserted, and LFC may be reset to zero. Thereafter, the method 500 may loop back to step 504 so as to obtain and process the next sample. On the other hand, if LFC is determined to not equal to the maximum count in step 516, then the method 500 may loop back to step 504 so as to obtain and process the next sample.

Figure 6:
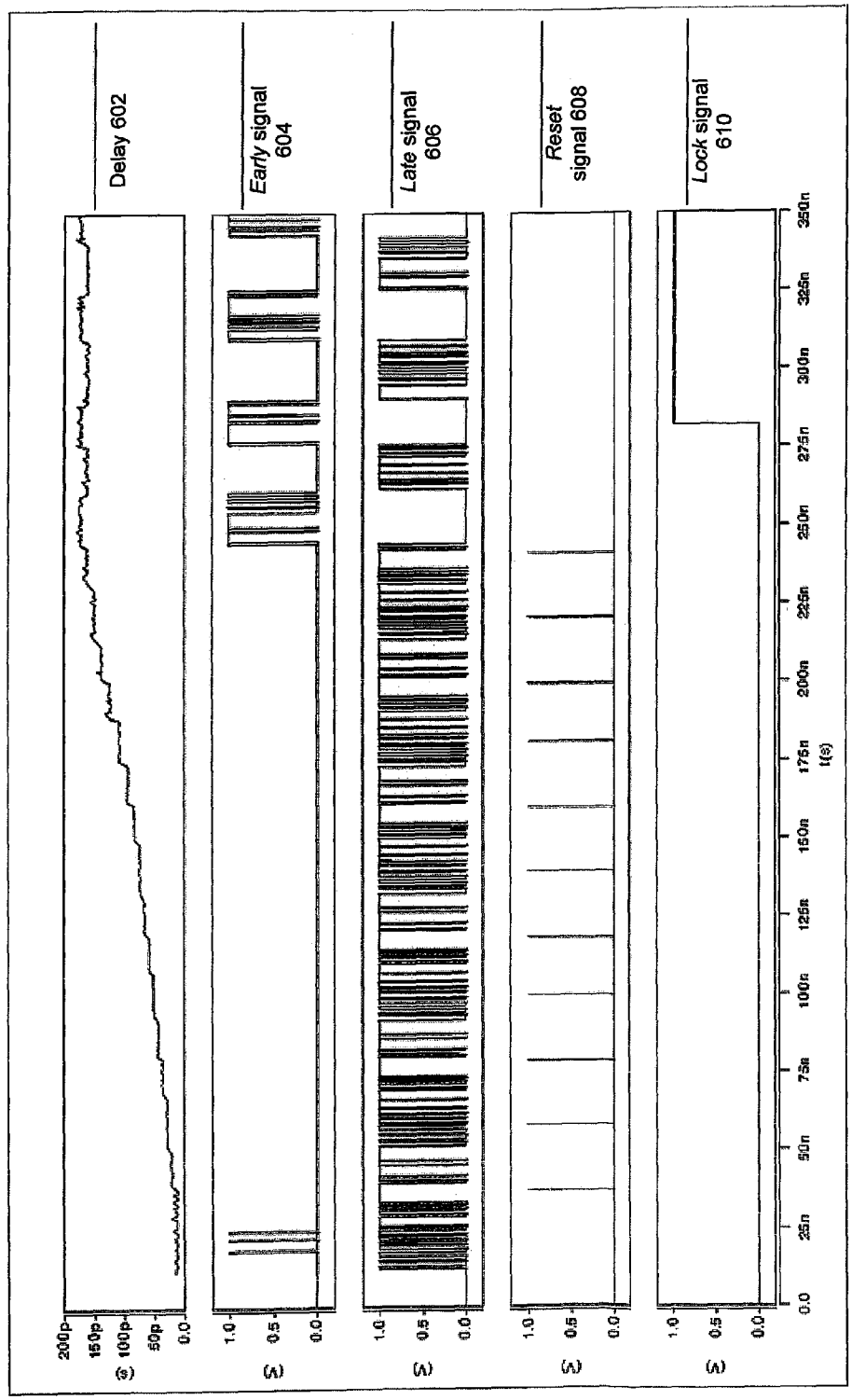
FIG. 6 shows example timing diagrams in relation to an embodiment of the invention.

FIG. 6 shows example timing diagrams in relation to an embodiment of the invention. The diagrams depict select signals in a computational simulation of the lock detection circuitry disclosed herein.

The first (top) diagram depicts delay 602 versus time t, where delay 602 is the time between the rising (or falling) edge of the sampling clock and the rising (or falling) edge of the input data. In this example, the ideal sampling point is at 160 pico seconds (ps) which is reached at or around t=240 nano seconds (ns). Sometime after the ideal sampling point is reached, the CDR may be determined to be in a lock state.

The second diagram depicts the early signal 604 which may be asserted by the sampler 102 in accordance with an embodiment of the invention. Meanwhile, the third diagram depicts the late signal 606 which may be asserted by the sampler 102 in accordance with an embodiment of the invention. As seen, in this example, the early and late signals begin to toggle interchangeably at or around t=240 ns.

The fourth diagram depicts the reset signal 608 which may be asserted by the dither detection circuit 202. As shown, reset pulses are asserted to reset the lock filter to prevent the lock signal from being asserted when the CDR is not in a lock state. The reset pulses are not asserted when the CDR is in a lock state. As shown, in this example, the last reset pulse is asserted at or around t=240 ns.

The fifth diagram depicts the lock signal which is asserted by the lock detection circuit 110 when the CDR is determined to be in a lock state. As shown, in this example, the lock signal is asserted at or around t=280 ns.

Figure 7:
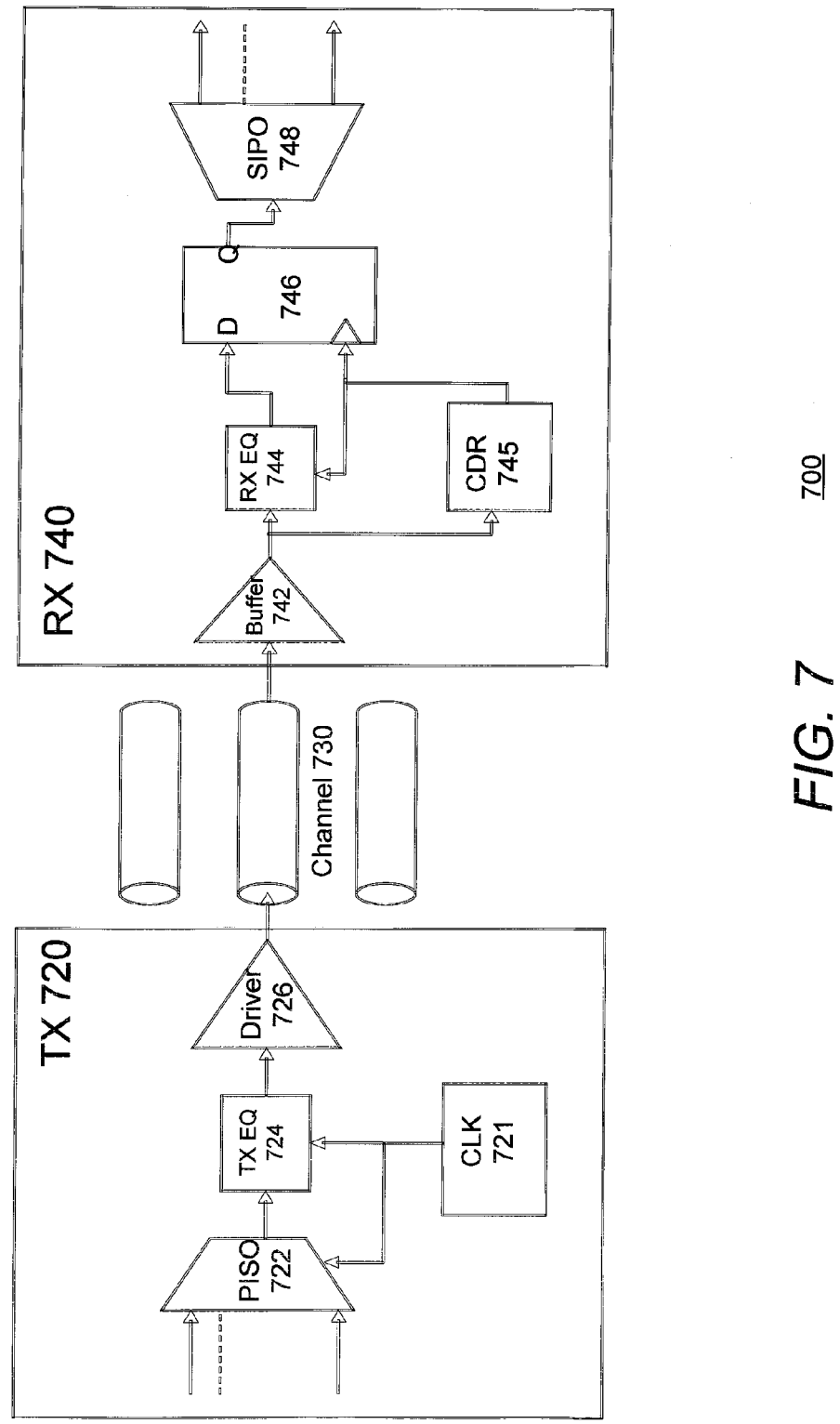
FIG. 7 is a high-level diagram of a communication link including a receiver within which the lock detection technique disclosed herein may be applied in accordance with an embodiment of the invention.

FIG. 7 is a high-level diagram of a communication link including a receiver within which the lock detection technique disclosed herein may be applied in accordance with an embodiment of the invention. As shown in FIG. 7, a communication link is generally composed of a transmitter (TX) 720, a receiver (RX) 740, and a communication channel (CH) 730 that is located in between the transmitter and the receiver.

The TX 720 may include a parallel-in-serial-out (PISO) circuit 722. The PISO (serializer) circuit 722 may be configured to receive parallel data signals and convert it to a serial data signal. For example, the transmitter 720 may be part of an integrated circuit, and the parallel data signals may be provided by a communication protocol module in the integrated circuit.

The serial data signal may be adjusted by a transmitter equalizer (TX EQ) circuit 724. In one embodiment, the TX EQ circuit 724 may implement a finite impulse response (FIR) equalization that pre-distorts the transmitted signal to compensate for signal distortion in the channel 730. Clock generator (CLK) circuit 721 may utilize a phase locked loop (PLL) circuit to provide a clock signal to the PISO 722 and TX EQ 724 circuits. The output from the TX EQ 724 circuit may be provided to a driver circuit 726. The driver circuit 726 may be configured to transmit the serial data signal over the channel 730.

The channel 730 communicates the serial data signal from the transmitter 720 to the receiver 740. The channel 730 may use multiple lanes to communicate the serial data signal.

The receiver 740 may be configured to receive the transmitted serial data signal from the multiple-lane channel into buffer circuitry 742. The buffer circuitry 742 may output the received serial data signal to receiver equalization (RX EQ) circuit 744 and to the clock and data recovery (CDR) circuit 745. In accordance with an embodiment of the invention, the CDR circuit 745 may use a lock detection circuit circuit, as disclosed herein, to indicate a lock state of the CDR circuit 745.

The RX EQ circuit 744 may be configured to perform one or more equalizations to compensate for high-frequency signal loss in the channel. The RX EQ circuit 744 may output an "equalized" serial data signal to a data input of a latch circuit 746.

The sampling clock may be provided from the CDR circuit 745 to clock inputs of the RX EQ circuit 744 and to a latch circuit 746. The latch circuit 746 may be configured to receive the equalized serial data signal from the RX EQ circuit 744 at its data input and to receive the sampling clock from the CDR circuit 745 at its clock input. The latch circuit 746 outputs the regenerated serial data signal to a serial-in-parallel-out (SIPO) circuit 748.

The SIPO (serializer) circuit 748 is configured to receive a serial data signal and convert it to parallel data signals. The parallel data signals may be provided to other circuitry of the receiving device. For example, the receiving device may be an integrated circuit, and the parallel data signals may be provided to a communication protocol module in the integrated circuit.

Figure 8:
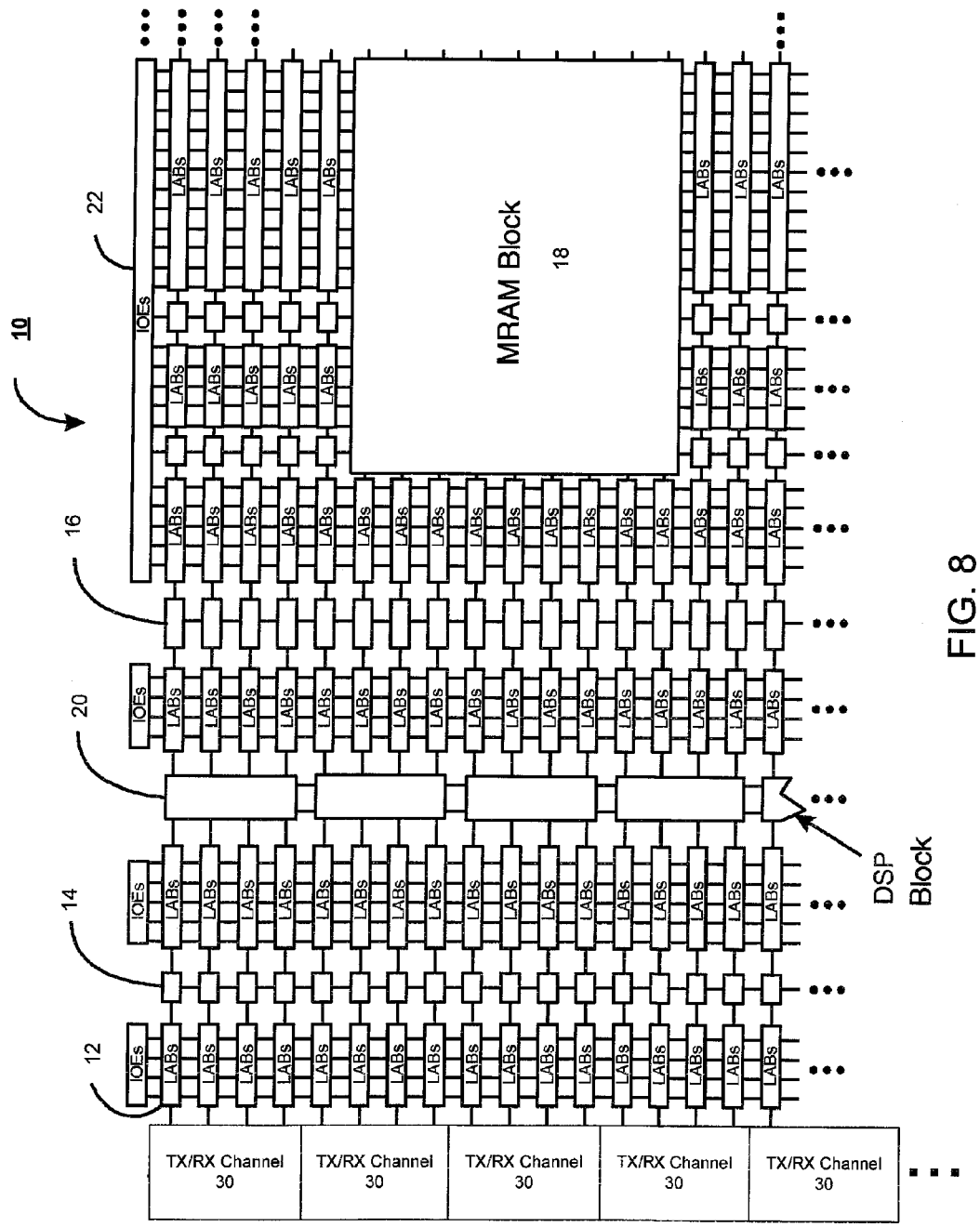
FIG. 8 is a simplified partial block diagram of a field programmable gate array (FPGA) including transceiver circuits within which the lock detection technique disclosed herein may be applied in accordance with an embodiment of the invention.

FIG. 8 is a simplified partial block diagram of a field programmable gate array (FPGA) 10 including transceiver circuits within which the lock detection technique disclosed herein may be applied in accordance with an embodiment of the invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10. A transceiver (TX/RX) channel array may be arranged as shown, for example, with each TX/RX channel circuit 30 being coupled to several LABs. A TX/RX channel circuit 30 may include, among other circuitry, the receiver circuitry described herein.

It is to be understood that FPGA 10 is described herein for illustrative purposes only and that the present invention can be implemented in many different types of PLDs, FPGAs, and ASICs.

Figure 9:
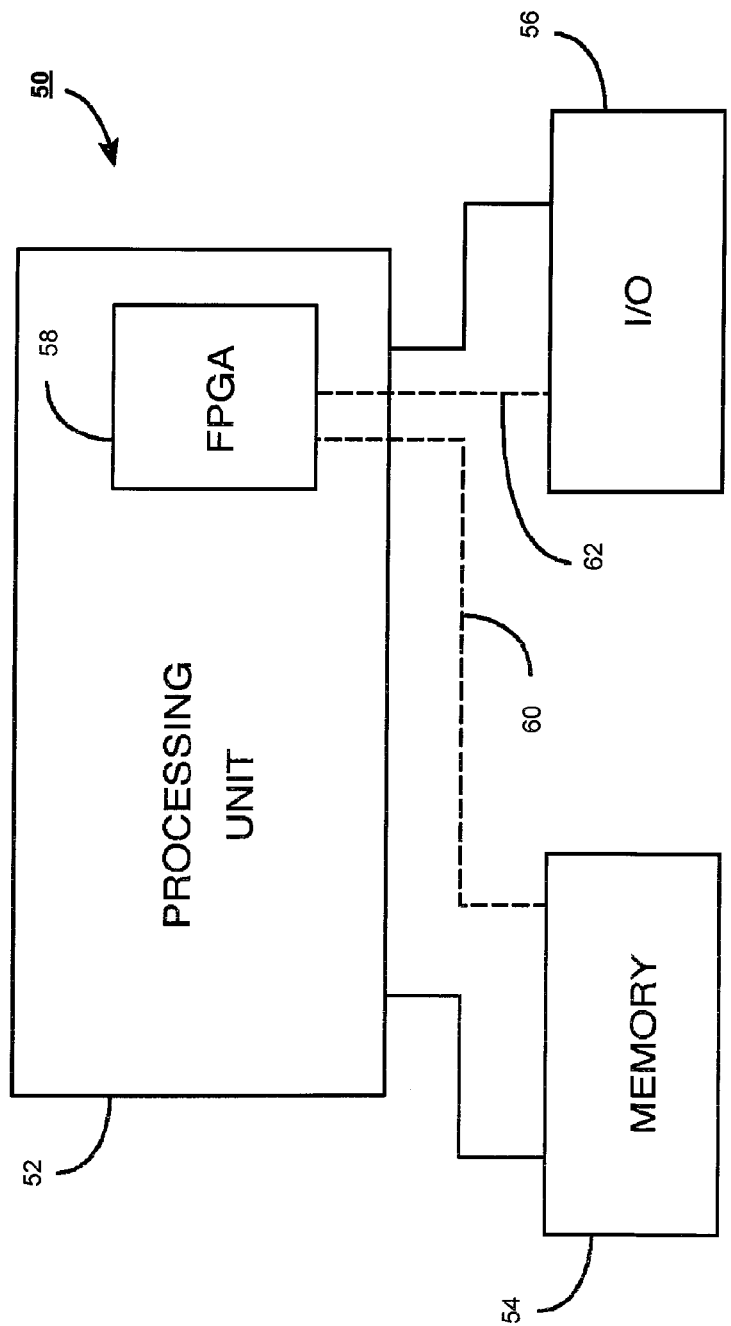
FIG. 9 is a block diagram of an exemplary digital system within which the lock detection technique disclosed herein may be utilized in accordance with an embodiment of the invention.

The present invention can also be implemented in a system that has a FPGA as one of several components. FIG. 9 is a block diagram of an exemplary digital system within which the lock detection technique disclosed herein may be utilized in accordance with an embodiment of the invention.

System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A lock detection circuit comprising:
   a dither detection circuit which maintains a bi-directional count based on early and late signals from a sampler circuit and asserts a non-lock signal if the bi-directional count reaches either a positive non-lock assertion threshold or a negative non-lock assertion threshold;
   a lock filter which increments a lock filter count for each sample and outputs a lock-initiated signal when the lock filter count reaches a pre-set maximum value; and
   a flip-flop circuit which receives the lock-initiated signal at a clock port, receives the non-lock signal at a reset port, has a data input port coupled to a supply voltage, and outputs the lock signal from a data output port.

2. The lock detection circuit of claim 1, wherein the maximum value of the lock filter count is greater than the non-lock assertion thresholds.

3. The lock detection circuit of claim 1, wherein the dither detection circuit comprises:
   a bi-directional counter which receives the early and late signals and maintains the bi-directional count;
   a polarity detection circuit which is arranged to output a polarity signal depending on a plurality of lower order bits of the bi-directional count; and
   logic which is configured to assert the non-lock signal depending on the polarity signal and one bit of the bi-directional count.

4. The lock detection circuit of claim 3, wherein the one bit of the bi-directional count is selected using a configurable selector.

5. The lock detection circuit of claim 3, wherein the polarity detection circuit comprises:
a first flip-flop for generating a negative polarity signal; and
a second flip-flop for generating a positive polarity signal.

6. The lock detection circuit of claim 5, wherein the first flip-flop includes a clock port that receives an output from first multiple-bit AND logic, a data input port coupled to a supply voltage, and a data output port that outputs the negative polarity signal, and the second flip-flop includes a clock port that receives an output from second multiple-bit AND logic, a data input port coupled to a supply voltage, and a data output port that outputs the positive polarity signal.

7. The lock detection circuit of claim 5, wherein the polarity detection circuit further comprises:
a first OR gate that receives both an output from third multiple-bit AND logic and the non-lock signal and that outputs a signal to a clear port of the first flip-flop; and
a second OR gate that receives both an output from fourth multiple-bit AND logic and the non-lock signal and that outputs a signal to a clear port of the second flip-flop.

8. A method for detecting a lock state for semi-digital or digital clock data recovery, the method comprising:
maintaining a bi-directional count based on early and late signals;
asserting a non-lock signal if the bi-directional count reaches either a positive non-lock assertion threshold or a negative non-lock assertion threshold; and
incrementing a lock filter count for each sample; and
outputting a lock-initiated signal when the lock filter count reaches a pre-set maximum value; and
receiving the lock-initiated signal at a clock port of a flip-flop;
receiving the non-lock signal at a reset port of the flip-flop;
receiving a supply voltage at a data input port of the flip-flop; and
outputting the lock signal from a data output port of the flip-flop.

9. The method of claim 8, wherein the maximum value of the lock filter count is greater than the non-lock assertion thresholds.

10. A clock and data recovery circuit with lock detection, the clock and data recovery circuit comprising:
a sampler circuit arranged to receive a data signal and a sampling clock and generate early and late signals which are responsive to a phase of the data signal relative to the sampling clock signal;
a digital filter circuit arranged to receive the early and late signals from the sampler circuit and to output up and down signals;
a phase interpolator controller arranged to receive the early and late signals from the digital filter and generate an interpolator control signal;
a phase interpolator circuit arranged to generate the sampling clock responsive to a reference clock and the interpolator control signal; and
a lock detection circuit arranged to receive the early and late signals from the sampler circuit and to output a lock signal;
wherein the lock detection circuit comprises:
a dither detection circuit which maintains a bi-directional count based on the early and late signals and asserts a non-lock signal if the bi-directional count reaches either a positive non-lock assertion threshold or a negative non-lock assertion threshold;
a lock filter which increments a lock filter count for each sample and outputs a lock-initiated signal when the lock filter count reaches a pre-set maximum value;
wherein the maximum value of the lock filter count is greater than the non-lock assertion thresholds; and
a flip-flop circuit that receives the lock-initiated signal at a clock port, receives the non-lock signal at a reset port, has a data input port coupled to a supply voltage, and outputs the lock signal from a data output port.

11. The clock and data recovery circuit of claim 10, wherein the dither detection circuit comprises:
a bi-directional counter which receives the early and late signals and maintains the bi-directional count;
a polarity detection circuit which is arranged to output a polarity signal depending on a plurality of lower order bits of the bi-directional count; and
logic which is configured to assert or de-assert the non-lock signal depending on the polarity signal and one bit of the bi-directional count.

12. The clock and data recovery circuit of claim 11, wherein the one bit of the bi-directional count is selected using a configurable selector.

13. The clock and data recovery circuit of claim 11, wherein the polarity detection circuit comprises:
a first flip-flop for generating a negative polarity signal; and
a second flip-flop for generating a positive polarity signal.

14. The clock and data recovery circuit of claim 13, wherein the first flip-flop includes a clock port that receives an output from first multiple-bit AND logic, a data input port coupled to a supply voltage, and a data output port that outputs the negative polarity signal, and the second flip-flop includes a clock port that receives an output from second multiple-bit AND logic, a data input port coupled to a supply voltage, and a data output port that outputs the positive polarity signal.

15. The clock and data recovery circuit of claim 13, wherein the polarity detection circuit further comprises:
a first OR gate that receives both an output from third multiple-bit AND logic and the non-lock signal and that outputs a signal to a clear port of the first flip-flop; and
a second OR gate that receives both an output from fourth multiple-bit AND logic and the non-lock signal and that outputs a signal to a clear port of the second flip-flop.

* * * * *